United States Patent [19]

Manzione et al.

[11] Patent Number: 5,578,261
[45] Date of Patent: Nov. 26, 1996

[54] METHOD OF ENCAPSULATING LARGE SUBSTRATE DEVICES USING RESERVOIR CAVITIES FOR BALANCED MOLD FILLING

[75] Inventors: Louis T. Manzione, Summit; John D. Weld, Succasunna, both of N.J.

[73] Assignee: Lucent Technologies Inc., Murray Hill, N.J.

[21] Appl. No.: 289,327

[22] Filed: Aug. 11, 1994

Related U.S. Application Data

[63] Continuation of Ser. No. 62,870, May 17, 1993, abandoned.

[51] Int. Cl.$^6$ ............................ B29C 45/14; B29C 70/70; B29C 33/10
[52] U.S. Cl. ............................ 264/272.15; 264/272.17; 264/275; 425/812
[58] Field of Search ................... 264/272.15, 272.17, 264/276, 328.12, 102, 271.1, 272.11, 275, 279.1, 328.8; 425/544, 546, 116, 812

[56] References Cited

U.S. PATENT DOCUMENTS

| | | | |
|---|---|---|---|
| 3,779,506 | 12/1973 | Adams | 249/110 |
| 3,951,580 | 4/1976 | Hobson | 425/812 |
| 4,096,228 | 6/1978 | Decker | 264/271 |
| 4,390,486 | 6/1983 | Hendry et al. | 425/812 |
| 4,513,942 | 4/1985 | Creasman | 264/276 |
| 4,540,534 | 9/1985 | Grendol | 264/328.9 |
| 4,580,962 | 4/1986 | Haas | 264/276 |
| 4,641,418 | 2/1987 | Meddles | 264/272.17 |
| 5,052,907 | 10/1991 | Matumoto et al. | 264/272.17 |
| 5,089,201 | 2/1992 | Takahashi | 264/328.9 |
| 5,197,183 | 3/1993 | Chia et al. | 264/272.17 |
| 5,316,463 | 5/1994 | Neu | 425/546 |
| 5,326,243 | 7/1994 | Fierkens | 264/272.17 |
| 5,368,805 | 11/1994 | Motai | 264/272.15 |

FOREIGN PATENT DOCUMENTS

| | | | |
|---|---|---|---|
| 61-117842 | 6/1986 | Japan | 425/812 |
| 62-128721 | 6/1987 | Japan . | |
| 62-145737 | 6/1987 | Japan | 425/812 |
| 6-15683 | 1/1994 | Japan | 425/546 |

*Primary Examiner*—Jan H. Silbaugh
*Assistant Examiner*—Angela Ortiz
*Attorney, Agent, or Firm*—John T. Rehberg

[57] ABSTRACT

Reservoir cavities have been used successfully to achieve proper mold filling of large area substrate packages with severe leading and lagging of flow fronts in the cavity halves, The additional plastic required to fill the reservoir cavities and the additional work in removing the reservoir culls is minimal, Reservoir cavities have been shown to eliminate void problems in molded packages with large printed wiring board substrates,

22 Claims, 1 Drawing Sheet

METHOD OF ENCAPSULATING LARGE SUBSTRATE DEVICES USING RESERVOIR CAVITIES FOR BALANCED MOLD FILLING

This application is a continuation of application Ser. No. 08/062,870, filed on May 17, 1993, now abandoned.

FIELD OF THE INVENTION

This invention relates to plastic packages for integrated circuit (IC) devices and more specifically to IC packages which contain large area substrates, e.g., multi-chip modules.

BACKGROUND OF THE INVENTION

Microelectronics devices are being developed with substrates of increasingly larger areas, yet there remains strong incentives to package these devices in conventional molded plastic packages. As the substrate area increases relative to the package, it becomes increasingly difficult to properly fill the mold. A large area substrate essentially divides the mold cavity into separate cavities above and below the substrate. The ability for molding compound to flow uniformly on both sides of the substrate diminishes with increased substrate area due to the reduced flow "communication" around the edges of the substrate. Any lead and lag of the flow fronts on either side of the substrate is no longer compensated by flow around the edges of the substrate.

Electronic devices with large area substrates include board mounted power modules (BMPMs) with large printed wiring board (PWB) substrates; thin, small outline packages (TSOPs) with large silicon die; multi-chip modules (MCMs) with silicon, ceramic or laminate substrates; and hybrid integrated circuits (HICs) with large ceramic or laminate substrates. These devices have substrate area to package area ratios (S/P ratios) ranging from 0.59 to 0.87 (see Table 1); whereas S/P ratios for conventional silicon device packages are typically 0.10 to 0.35.

TABLE 1

Typical substrate area to package area ratios for various electronic components.

|  | BMPMs | TSOPs | MCMs | HICs |
| --- | --- | --- | --- | --- |
| substrate dimensions (in) | 1.08 × 1.9 | 0.425 × 0.335 | 0.9 × 0.9 | 1.0 × 1.0 |
| package dimensions (in) | 1.18 × 2.0 | 0.49 × 0.395 | 1.17 × 1.17 | 1.14 × 1.14 |
| S/P ratio | 0.87 | 0.74 | 0.59 | 0.76 |

SUMMARY OF THE INVENTION

This invention is directed to the use of reservoir cavities to balance the flow in a mold cavity between the flow fronts above and below a large area substrate. A reservoir cavity contains only excess plastic which is separated from the molded package and discarded.

One aspect of the invention includes a method for packaging an electronic device substrate in a plastic encapsulant, the substrate having a top surface and a bottom surface, the surfaces separated by a plurality of edges including first and second edges disposed on opposite sides of the substrate, the method comprising the steps of placing the substrate to be encapsulated into a mold cavity of a mold, leaving an upper void space between the top surface of the substrate and a top surface of the mold cavity, a lower void space between the bottom surface of the substrate and a bottom surface of the mold cavity, and spaces along the edges of the substrate which connect the upper void space and the lower void space, introducing plastic molding material into the mold cavity at a first region in the mold cavity adjacent to the first edge of the substrate, flowing the molding material into the upper void space and into the lower void space so that the molding material flows with a first flow front through the upper void space and simultaneously with a second flow front through the lower void space with both of the flow fronts flowing toward a second region of the mold cavity located opposite to the first region and adjacent to the second edge of the substrate, with one of the flow fronts leading the other, thereby creating a leading flow front and a lagging flow front, and flowing the molding material in the leading flow front through an opening in the second region into an overflow reservoir outside the mold cavity, thereby causing the molding material to flow into the overflow reservoir prior to complete filling of the mold cavity with the molding material and preventing the leading flow front from entering the void space occupied by the lagging flow front.

In certain embodiments of the invention, the substrate may support at least one semiconductor chip, multiple semiconductor chips, of multiple passive components. In addition, the area of the substrate may be at least 50% of the area of the mold measured in the plane of the substrate.

DETAILED DESCRIPTION

The filling of a mold cavity for a conventional silicon integrated circuit (IC) is influenced by the thickness of the cavity halves above and below the device, the permeability of the leadframe, the molding compound rheology, and the location of the gate into the cavity. The gate is typically located along the parting line of the mold adjacent to the leadframe, so the initial flow into the mold is on one side of the leadframe. The molding compound flows to the other side of the leadframe through the leads. The progressing flow fronts above and below the device may not advance at the same rate, with one flow front leading the other. This lead-lag between the flow fronts depends on many factors, but it is primarily dependent on the thicknesses of the cavity halves. Typically, the leading front is in the larger cavity half since this thicker half usually provides the lower resistance, but the leading front can be in the thinner cavity if the shear thinning behavior of the molding compound makes this the lower resistance path. In cases where the lead and lag is large, the leading front can reach the end of the cavity, seal the vent, wrap around and begin filling the lagging cavity. This usually results in a large air void as illustrated in FIG. 1.

Figure 1:
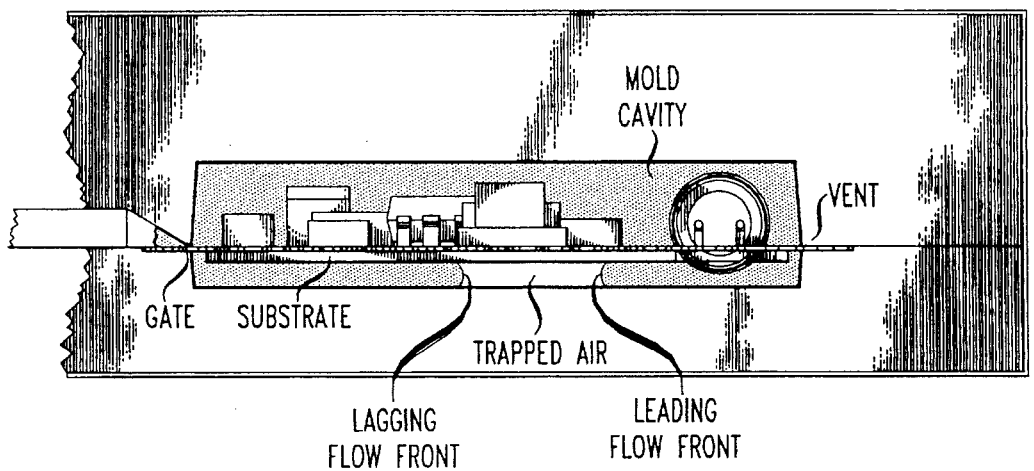
FIG. 1: Mold cross-section of a conventional mold with a large area substrate. The leading cavity flow front wraps around the substrate, sealing the vent, and trapping air in the mold.

A reservoir cavity allows molding compound in the leading cavity flow front to continue flowing through and out of the mold cavity, preventing it from wrapping around the substrate, and trapping air in the lagging cavity as was shown in FIG. 1. Instead, the leading front flows out of the mold cavity into the reservoir cavity because it finds that to be the flow path of lower resistance compared to the high pressures encountered in the lagging cavity as the air them is compressed by the moving front. This compressed air is also pushed into the reservoir cavity, displacing the flow from the leading front intermittently. In effect, the reservoir cavity provides the opportunity to include an oversized vent to the mold cavity that does not become clogged with the molding compound from the leading flow front.

Figure 2:
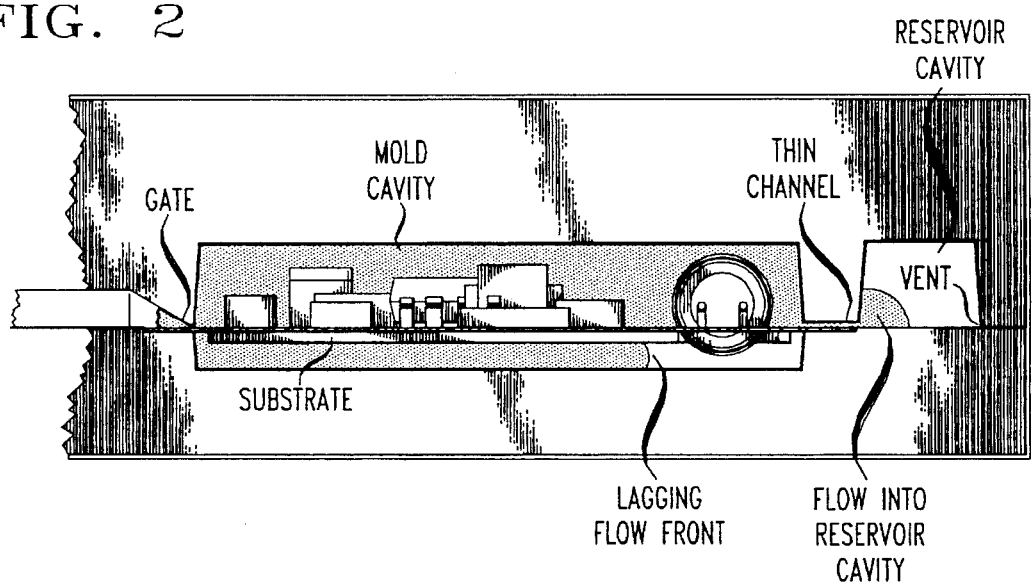
FIG. 2: Mold cross-section of a mold with a large area substrate and a reservoir cavity according to this invention: The leading cavity flow front flows into the reservoir cavity allowing the lagging cavity flow front to continue filling, pushing the air out of the mold.
Figure 3:
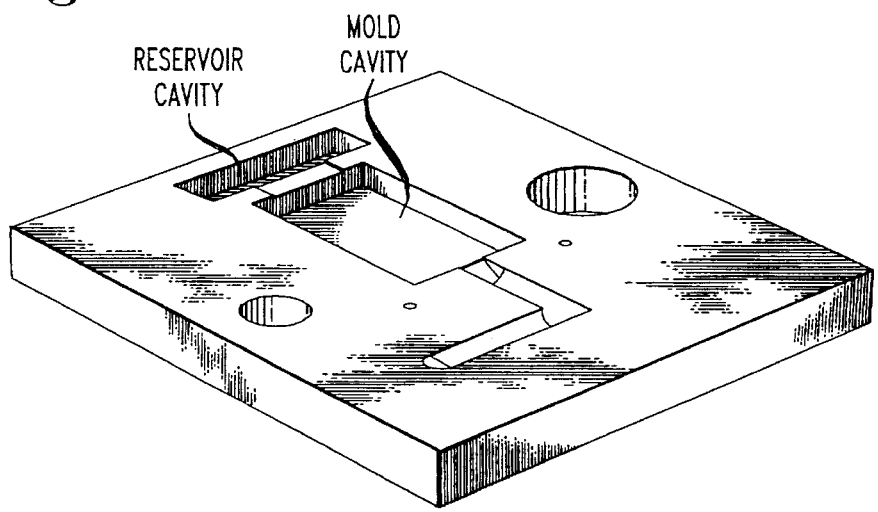
FIG. 3: A perspective view of a mold with a large area substrate and corresponding reservoir cavity.

A reservoir cavity is connected to the mold cavity by a thin channel along the parting line of the mold and at the end of the mold cavity, usually at the original mold vent location (see FIG. 2). This thin channel allows for easy and clean removal of the reservoir cavity from the molded package. The thin channel is located in the mold half with the leading flow front, and is sized to allow both molding compound and air to flow simultaneously. For many packages with large substrates, the depth of this channel can typically be between 0.002–0.022 inches. Its width is a fraction of the package width up to 100%, typically between 20%–100%. This channel may leave a distinct scar on the molded body which indicates its usage, but does not harm the function, handling or reliability of the package. The mold vent is relocated into the reservoir cavity. The air in the mold is then vented through the reservoir cavity. The volume of the reservoir cavity should be large enough to allow all the air in the lagging cavity half to completely evacuate the mold cavity. FIG. 3 shows a mold with its corresponding reservoir cavity. Air voids in the reservoir cavity are acceptable, since the reservoir cavity is detached and discarded.

The concept was tested thoroughly during the process development for molded plastic packaging of a printed wiring board module. The large printed wiring board substrate of these components, and the large asymmetry in the cavity thicknesses above and below the substrate, caused voids to form in the lower, thinner cavity consistently. Flow visualization studies, such as short-shot sequences, indicated that the wrap-around of the leading front was the mechanism responsible for this void problem. Incorporating a reservoir cavity into the mold, combined with its careful optimization, has completely and consistently eliminated the problem.

We claim:

1. A method for packaging an electronic device substrate in a plastic encapsulant, said substrate having a top surface and a bottom surface, said surfaces separated by a plurality of edges including first and second edges disposed on opposite sides of said substrate, the method comprising the steps of:

placing the substrate to be encapsulated into a mold cavity of a mold, leaving an upper void space between the top surface of the substrate and a top surface of the mold cavity, a lower void space between the bottom surface of the substrate and a bottom surface of the mold cavity, and spaces along the edges of the substrate which connect the upper void space and the lower void space, introducing plastic molding material into the mold cavity at a first region in the mold cavity adjacent to the first edge of the substrate, flowing said molding material into the upper void space and into the lower void space so that the molding material flows with a first flow front through the upper void space and simultaneously with a second flow front through the lower void space with both of said flow fronts flowing toward a second region of the mold cavity located opposite to the first region and adjacent to the second edge of the substrate, with one of said flow fronts leading the other, thereby creating a leading flow front and a lagging flow front, flowing said molding material in the leading flow front through an opening in said second region into an overflow reservoir outside the mold cavity, thereby causing the molding material to flow into the overflow reservoir prior to complete filling of the mold cavity with the molding material and preventing said leading flow front from entering the void space occupied by the lagging flow front, and evacuating all air in the mold cavity through the opening into the overflow reservoir.

2. The method of claim 1 in which the substrate supports at least one semiconductor chip.

3. The method of claim 2 in which the substrate supports multiple semiconductor chips.

4. The method of claim 1 in which the area of the substrate is at least 50% of the area of the mold measured in the plane of the substrate.

5. The method of claim 1 in which the substrate supports multiple passive components.

6. The method of claim 1 in which preventing the leading flow front from entering the void space occupied by the lagging flow front includes providing the leading flow front with a lower resistance flow path at the overflow reservoir than at the void space occupied by the lagging flow front.

7. The method of claim 6 in which the void space occupied by the lagging flow front includes compressed air which is compressed by the lagging flow front.

8. The method of claim 7 in which the compressed air is pushed from the void space occupied by the lagging flow front into the overflow reservoir.

9. The method of claim 8 in which pushing the compressed air into the overflow reservoir includes displacing a flow from the leading flow front intermittently.

10. The method of claim 1 in which the mold cavity includes a first cavity half and a second cavity half, the first cavity half being larger than the second cavity half.

11. The method of claim 10 in which the leading flow front flows in the first cavity half and the lagging flow front flows in the second cavity half.

12. The method of claim 10 in which the leading flow front flows in the second cavity half and the lagging flow front flows in the first cavity half.

13. The method of claim 12 in which the molding compound exhibits shear thinning behavior.

14. The method of claim 1 in which the overflow reservoir is a reservoir cavity in the mold, with the mold cavity and the reservoir cavity being separate cavities.

15. The method of claim 14 in which a channel in the mold is between the mold cavity and the reservoir cavity.

16. The method of claim 15 in which the channel is sized to allow both the molding compound and air in the mold cavity to flow into the reservoir cavity simultaneously.

17. The method of claim 15 in which the mold includes a first mold half and a second mold half, the leading flow front occurs in the first mold half, and the opening, the channel, and the reservoir cavity are located in the first mold half and are not located in the second mold half.

18. The method of claim 15 in which the channel has a depth in the range of 0.002 to 0.022 inches.

19. The method of claim 15 in which the molding material in the reservoir cavity is detached and discarded from the molding material in the mold cavity.

20. The method of claim 15 in which molding material in the channel allows easy and clean removal of the molding material in the reservoir cavity from the molding material in the mold cavity.

21. The method of claim 15 in which the reservoir cavity is between the channel and a vent in the mold.

22. A method for packaging an electronic device substrate in a plastic encapsulant, comprising the steps of:

providing a substrate with a top surface, a bottom surface, and a plurality of edges, placing the substrate to be encapsulated into a mold cavity of a mold, leaving an upper void space between the top surface of the substrate and a top surface of the mold cavity, a lower void space between the bottom surface of the substrate and a bottom surface of the mold cavity, and spaces along the edges of the substrate which connect the upper void space and the lower void space, introducing plastic molding material into a first region in the mold cavity, flowing the molding material from the first region into the upper void space and into the lower void space so that the molding material flows with a leading flow front in one of the void spaces and a lagging flow front in the other of the void spaces, the leading and lagging flow fronts advancing at different flow rates toward a second region in the mold cavity located opposite to the first region, flowing the molding material in the leading flow front through an opening in the second region into a reservoir cavity outside the mold cavity and in the mold, thereby causing the molding material to flow into the reservoir cavity prior to complete filling of the mold cavity with the molding material and preventing the leading flow front from entering the void space occupied by the lagging flow front, compressing air in the void space occupied by the lagging flow front, and pushing the compressed air through the opening into the reservoir cavity, including displacing a flow from the leading flow front intermittently, thereby evacuating all air in the mold cavity through the opening into the reservoir cavity.

* * * * *